United States Patent
Hsieh

(10) Patent No.: US 10,317,429 B2
(45) Date of Patent: Jun. 11, 2019

(54) BOLT TYPE PROBE

(71) Applicant: CHUNGHWA PRECISION TEST TECH. CO., LTD., Taoyuan (TW)

(72) Inventor: Chih-Peng Hsieh, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 212 days.

(21) Appl. No.: 15/437,464

(22) Filed: Feb. 21, 2017

(65) Prior Publication Data

US 2018/0080955 A1 Mar. 22, 2018

(30) Foreign Application Priority Data

Sep. 20, 2016 (TW) .............................. 105130350 A

(51) Int. Cl.
  *G01R 1/067* (2006.01)
  *G01R 31/28* (2006.01)
(52) U.S. Cl.
  CPC ..... *G01R 1/06722* (2013.01); *G01R 1/06733* (2013.01); *G01R 31/2886* (2013.01)

(58) Field of Classification Search
  None
  See application file for complete search history.

(56) References Cited

U.S. PATENT DOCUMENTS 9,059,545 B2 * 6/2015 Mason ................. H01R 12/714

FOREIGN PATENT DOCUMENTS

WO  WO-2012098837 A1 *  7/2012  ......... G01R 1/06722

* cited by examiner

*Primary Examiner* — Paresh H Patel
(74) *Attorney, Agent, or Firm* — Mark M. Friedman

(57) ABSTRACT

A bolt type probe is provided, including a probe head having a bolt at one end thereof, a probe tail having a bolt hole corresponding to the bolt, an elastic element connected with the probe head and the probe tail. At least one portion of the bolt of the probe head is inserted in the bolt hole of the probe tail, and the bolt is moved relative to the bolt hole along with a movement of the elastic element.

10 Claims, 5 Drawing Sheets

BOLT TYPE PROBE

FIELD OF THE DISCLOSURE

The present disclosure relates to a bolt type probe, and more particularly to a probe used in a probe card.

BACKGROUND

Recently, with electronic products developing towards precision and versatility, the chip structure of integrated circuits used in electronic products tends to be complicated. At the time of manufacture, in order to ensure the electrical quality of the wafer, wafer-level measurement is performed before packaging the wafer. The current measuring method for testing wafers needs a probe card. According to the type of probes, probe card type includes a cantilever probe card and a vertical probe card. In use, the probes of the probe card are directly electrically contacted with pads or bumps of the wafer, and then an electrical signal is transmitted into a tester through a circuit board of the probe card, such that a testing signal from the tester is transmitted into the wafer, or an output signal from the wafer can be received by the tester, thereby achieving the measurement of the electrical properties of the wafer. Moreover, the user can remove a bad wafer according to the measurement results, so as to save unnecessary packaging costs.

FIG. 1 depicts a structural diagram of a spring probe 10 in the prior art. The spring probe 10 includes a probe head 11 and an elastic element 12. A terminal of the elastic element 12 is welded with the probe head 11, and the other terminal of the elastic element 12 is used for assembling with a probe card. FIG. 2 depicts another structural diagram of a spring probe 20 in the prior art. The spring probe 20 includes a probe head 21, an elastic element 22, and a probe tail 23. The spring probe 20 is roughly similar to the spring probe 10, and the difference between them are that two terminals of the elastic element 22 of the spring probe 20 are welded with the probe head 21 and the probe tail 23, respectively, and another terminal of the probe tail 23 is used for assembling with a probe card. Furthermore, the spring probe 20 may include a position sleeve (not shown in the drawing), which is sleeved onto the elastic element 22 for limiting the elastic element 22 to move forward and back in a straight line, thereby ensuring that there is no traverse movement in the corresponding position of the probe head 21 and the probe tail 23.

When measured by the conventional spring probe 10 or 20, the probe head 11 or 21 is firstly aligned with a pad or a bump of the wafer, and then pressure is applied to the spring probe 10 or 20 to ensure that the probe head 11 or 21 is effectively in electrical contact with the wafer, thereby transmitting current through the spring probe 10 or 20. That is, the current must be transmitted through the elastic element 12 or 22. However, in order to ensure the elastic deformation ability of the elastic element 12 or 22, the elastic material of the elastic element 12 or 22 must have a small cross-section area. Thus, if the current exceeds the maximum withstand current of the elastic elements 12 and 22, the elastic elements 12 and 22 may be deformed due to overheating that results in the so-called "needle burning". On the other hand, when the spring probes 10 and 20 perform high-speed signal transmission, since the transmission path of the elastic elements 12 and 22 is too long, an inductance effect is likely to occur, thereby affecting the signal quality.

Accordingly, it is necessary to provide an improved probe structure to solve the technical problem in the prior art.

SUMMARY OF THE DISCLOSURE

In order to solve the above-mentioned technical problems, an object of the present disclosure is to provide a probe including a specific conductive structure, which is connected between a probe head and a probe tail for transmitting current and signals. Moreover, since the conductive structure has a certain sized cross-section area, the "needle burning" caused by the current exceeding the maximum withstand current of the conductive structure such that the conductive structure is deformed due to overheating can be prevented. Furthermore, the conductive structure is formed with the straight line configuration without bending, so that the current and the signal are transmitted through the straight path of the conductive structure. Hence, the high frequency and high speed transmission can be achieved and the inductance generated from transmitting the signal is relatively small.

In order to achieve the above object, the present disclosure provides a bolt type probe, comprising: a probe head comprising a bolt at one end thereof and a probe tip at another end of the probe head, a probe tail disposed on a same axis as the probe head, and the probe tail comprising a bolt hole corresponding to the bolt, where at least one portion of the bolt of the probe head is inserted into the bolt hole, and an elastic element connected with the probe head and the probe tail, and made of elastic material, where the bolt of the probe head is surrounded by the elastic material, where by either applying a force to or releasing the force from the probe head, the elastic element moves a straight line, and where when the elastic element moves in the straight line, the bolt moves relative to the bolt hole along with a movement of the elastic element.

In one preferable embodiment of the present disclosure, the bolt hole of the probe tail includes an opening and a bottom portion, when the force is released from the probe head, an end of the bolt is spaced a distance from the bottom portion of the bolt hole, and when the elastic element is compressed, the distance is shortened accordingly.

In one preferable embodiment of the present disclosure, an outer surface of the bolt of the probe head contacts an inner surface of the bolt hole of the probe tail.

In one preferable embodiment of the present disclosure, a material of the inner surface of the bolt hole of the probe tail comprises a conductive material with a low friction coefficient.

In one preferable embodiment of the present disclosure, the conductive material with the low friction coefficient includes graphite.

In one preferable embodiment of the present disclosure, a cross-section area of the bolt of the probe head is greater than a cross-section area of the elastic material of the elastic element.

In one preferable embodiment of the present disclosure, the bolt of the probe head is a linear cylindrical structure without bending.

In one preferable embodiment of the present disclosure, the probe head further comprises a first fixed piece disposed thereon, and a first slot corresponding to the first fixed piece is formed on a first opening end of the elastic element, and the elastic element is connected with the probe head by engaging the first slot with the first fixed piece.

In one preferable embodiment of the present disclosure, the probe tail further comprises a second fixed piece disposed thereon, and a second slot corresponding to the second fixed piece is formed on a second opening end opposite the first opening end of the elastic element, and the elastic element is connected with the probe tail by engaging the second slot with the second fixed piece.

In one preferable embodiment of the present disclosure, the probe head and the probe tail are constituted by an inner conductive material and an outer conductive material, and the outer conductive material covers the inner conductive material.

In one preferable embodiment of the present disclosure, a conductivity of the outer conductive material is greater than a conductivity of the inner conductive material, and a hardness of the inner conductive material is greater than a hardness of the outer conductive material.

In one preferable embodiment of the present disclosure, the bolt and the probe tip of the probe head are integrally formed.

DETAILED DESCRIPTION

The structure and the technical means adopted by the present disclosure to achieve the above and other objects can be best understood by referring to the following detailed description of the preferred embodiments and the accompanying drawings.

Figure 1:
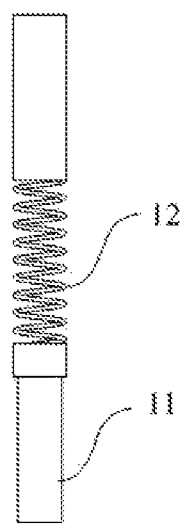
FIG. 1 depicts a structural diagram of a spring probe in the prior art.
Figure 2:
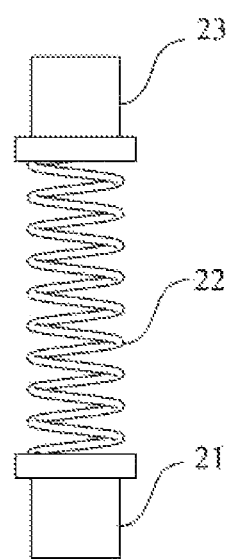
FIG. 2 depicts another structural diagram of a spring probe in the prior art.
Figure 3:
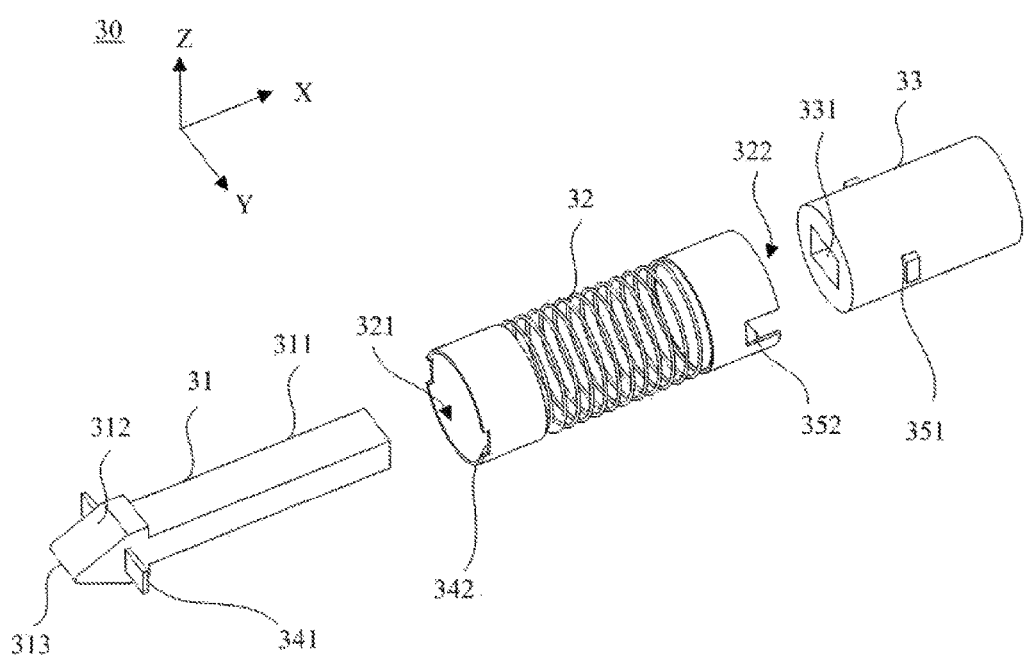
FIG. 3 depicts a stereoscopic exploded diagram of a bolt type probe according to a preferred embodiment of the present disclosure.

FIG. 3 depicts a stereoscopic exploded diagram of a bolt type probe according to a preferred embodiment of the present disclosure. The bolt type probe 30 is used for assembling with a probe device of a probe card. The bolt type probe 30 includes a probe head 31, an elastic element 32, and a probe tail 33. The elastic element 32 is connected with the probe head 31 and the probe tail 33. The probe head 31 and the probe tail 33 are disposed in alignment with the same axis (i.e., X axis). The elastic element 32 is made of elastic material, and the bolt of the probe head is surrounded by the elastic material. The probe head 31 includes a probe head section 312 and a bolt 311 connected with the probe head section 312. Moreover, the probe head section 312 includes a probe tip 313, which is formed with a flat configuration, a rounded configuration, a point-like configuration (as shown in FIG. 3), or a multi-claw configuration, but the present disclosure is not limited thereto. Preferably, the probe head 31 is formed in a one-piece configuration. That is, the probe head section 312, the probe tip 313, and the bolt 311 are integrally formed. Furthermore, as shown in FIG. 3, the probe tail 33 is form with a cylindrical structure, but in another embodiment, the probe tail 33 may be formed with a different configuration, and the present disclosure is not limited thereto. As shown in FIG. 3, a bolt hole 331 is formed on a center of the probe tail 33. The position, size, and shape of the bolt hole 331 correspond to the bolt 311 of the probe head 31. It should be noted that in this embodiment, the bolt 311 has a square-column configuration, and the opening of the bolt hole 331 has a square configuration. However, in another embodiment, the bolt 311 and the bolt hole 331 may be formed with a different configuration, as long as the two structures can match each other.

Figure 4:
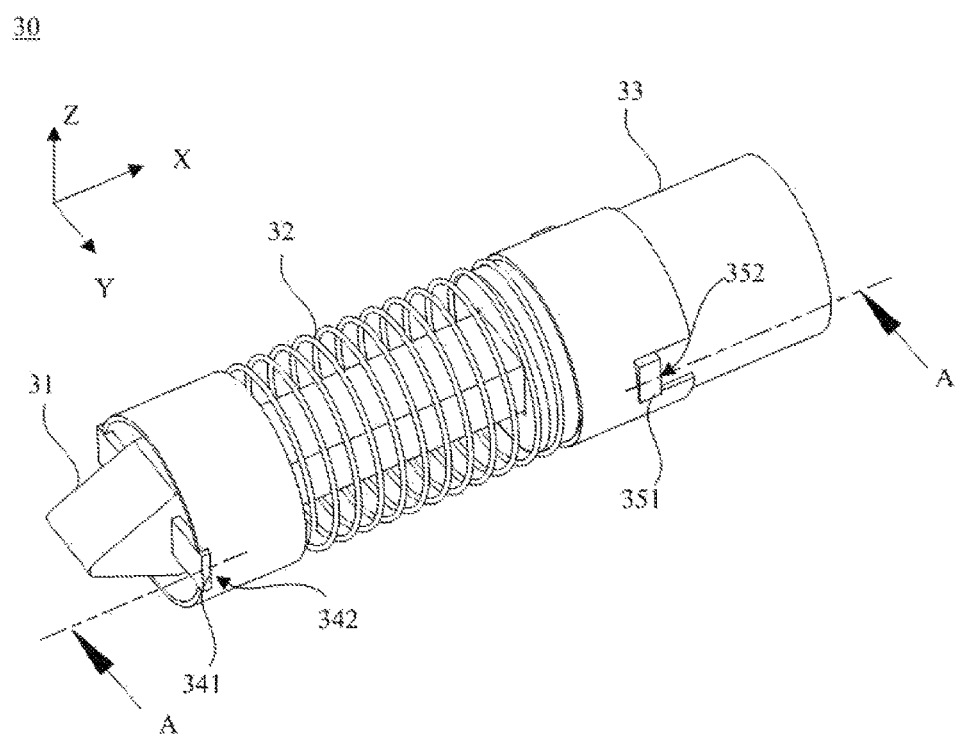
FIG. 4 depicts a stereoscopic assembly diagram of the bolt type probe of FIG. 3.

FIG. 4 depicts a stereoscopic assembly diagram of the bolt type probe 30 of FIG. 3. A pair of first fixed pieces 341 is formed on the probe head 31, and a pair of the second fixed pieces 351 is formed on the probe tail 33. The elastic element 32 includes a first opening end 321 and a second opening end 322 corresponding to the first opening end 321. A pair of first slots 342 corresponding to the first fixed pieces 341 are formed on the first opening end 321 of the elastic element 32, and a pair of second slots 352 corresponding to the pair of the second fixed pieces 351 are formed on the second opening end 322 of the elastic element 32. As shown in FIG. 4, after the probe head 31, the elastic element 32, and the probe tail 33 are assembled, the elastic element 32 is connected with the probe head 31 by engaging the first slot 342 with the first fixed piece 341, and the elastic element 32 is connected with the probe tail 33 by engaging the second slot 352 with the second fixed piece 351. Hence, the probe head 31, the elastic element 32, and the probe tail 33 are fixedly connected with each other by using the above-mentioned elements. Also, the second fixed piece 351 engages with the second slot 352 by the first fixed piece 341 and the first slot 342, such that there is no relative rotational offset between the probe head 31, the elastic element 32, and the probe tail 33. It should be understood that the number, shape, and size of the first fixed piece 341, the first slot 342, the second fixed piece 351, and the second slot 352 are only examples, and are not limited thereto.

Figure 5:
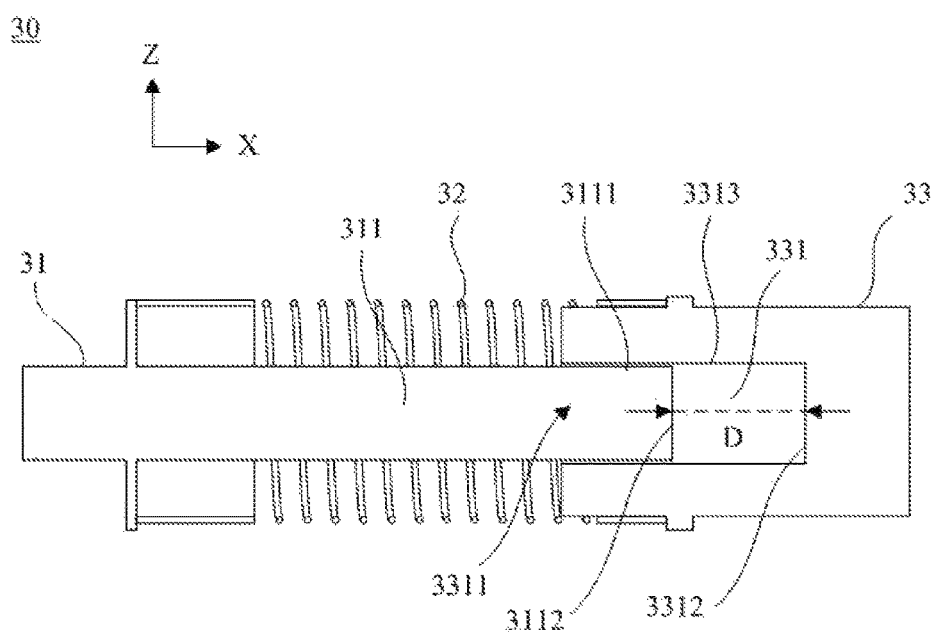
FIG. 5 depicts a cross-sectional view along line A-A of FIG. 4.

FIG. 5 depicts a cross-sectional view along line A-A of FIG. 4. The bolt hole 331 of the probe tail 33 includes an opening 3311, a bottom portion 3312, and an inner surface 3313. At least one portion of the bolt 311 is inserted into the bolt hole 331. The outer surface 3111 of the bolt 311 of the probe head 31 is contacted with the inner surface 3313 of the bolt hole 331 of the probe tail 33. It should be noted that the probe head 31 and the probe tail 33 of the bolt type probe 30 are made of conductive material (e.g., metal, graphite, etc.) Thus, the current can be smoothly transmitted on the bolt type probe 30 through the inner surface 3313 and the outer surface 3111 which are contacted with each other. In addition, an end 3112 of the bolt 311 is spaced a distance D from the bottom portion 3312 of the bolt hole 331 before the elastic element is compressed. It should be understood that a movement space of the bolt 311 being relatively moved within the bolt hole 331 is defined by the distance D.

Figure 6:
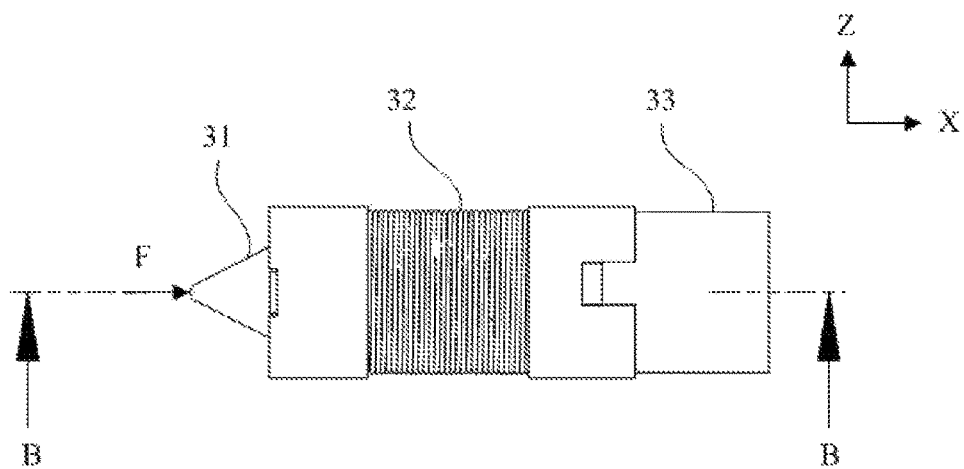
FIG. 6 depicts a diagram of the bolt type probe of FIG. 4 after applying a pressure.
Figure 7:
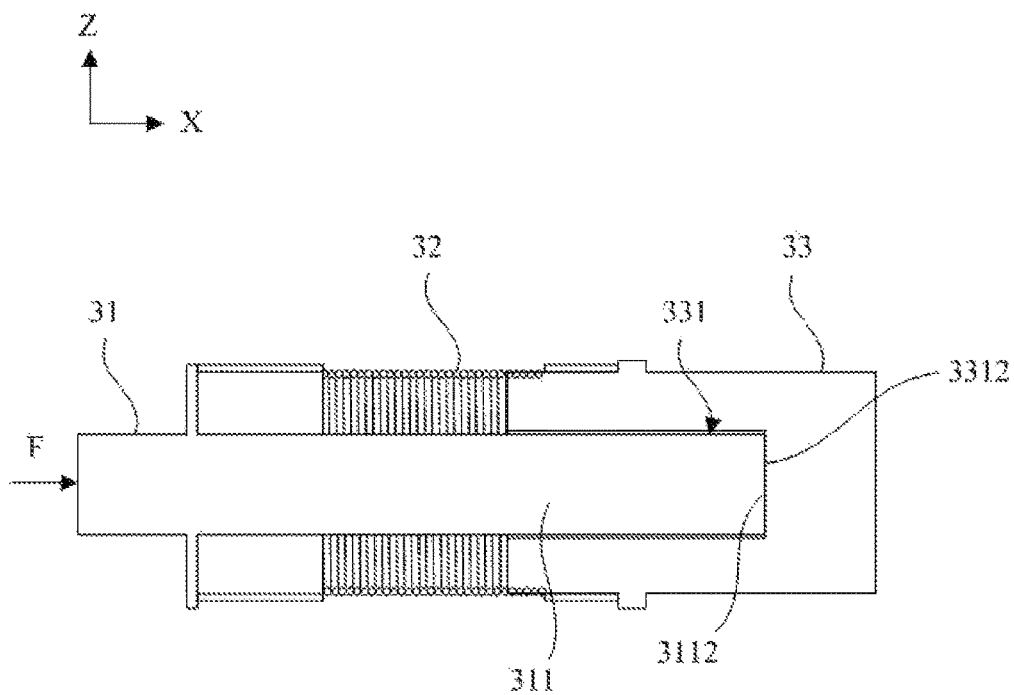
FIG. 7 depicts a cross-sectional view along line B-B of FIG. 6.

FIG. 6 depicts a diagram of the bolt type probe of FIG. 4 after applying a pressure. FIG. 7 depicts a cross-sectional view along line B-B of FIG. 6. The elastic element 32 is made of elastic material, for example it is formed by winding the elastic material. Thus, by applying or releasing a force to the probe head 31, the elastic element 32 can be moved along a straight line (e.g., a line in the X-direction), such as a reciprocating movement. When the elastic element 32 is moved along the straight line, the bolt 311 of the probe head 31 is moved within the bolt hole 331 accordingly. Specifically, after a force F is applied on the probe head 31 of the bolt type probe 30, the elastic element 32 undergoes compressed elastic deformation, and the distance between the end 3112 of the bolt 311 and the bottom portion 3312 of the bolt hole 331 is shortened accordingly. That is, the end 3112 of the bolt 311 approaches the bottom portion 3312 of the bolt hole 331 and eventually it abuts against the bottom portion 3312, i.e., the distance D is 0. Furthermore, if the force F is released, the end 3112 of the bolt 311 is away from the bottom portion 3312 of the bolt hole 331. It should be noted that there is no structural interference between the elastic element 32 and the bolt 311 of the probe head 31, thereby ensuring the elastic element 32 can be smoothly operated.

When a wafer is tested by a probe card having the bolt type probe 30, the probe tail 33 of the bolt type probe 30 is firstly electrically connected to a pad (e.g., a metallic pad, a metallic bump, a solder ball, etc.) of a circuit board of the probe card, and the probe head section 312 of the probe head 31 is aligned with a corresponding pad or bump of a device under test (e.g., a wafer), and then a force F is applied to the bolt type probe 30, such that the elastic element 32 is elastically deformed to ensure that the probe head 31 is effectively in electrical contact with the wafer. Thus, a testing signal from the tester is transmitted into the device under test, or an output signal from the device under test can be received by the tester, thereby achieving the measurement of the electrical properties of the device under test. Moreover, the user can remove a bad device under test according to the measurement results, so as to save unnecessary packaging costs.

It should be noted that due to the skin effect, the transmitting current will be concentrated on the surface of the conductor. Thus, in the present disclosure, in order to enhance the transfer efficiency of the current, the probe head 31 and the probe tail 33 are constituted by an inner conductive material and an outer conductive material, and the inner conductive material is covered by the outer conductive material. Moreover, the outer conductive material is made of a material having a high electrical conductivity with respect to the inner conductive material. Furthermore, in order to improve the strength of the overall structure, the inner conductive material is made of a material having a relatively high hardness relative to the outer conductive material. Preferably, the outer conductive material may be made of a material having high electrical conductivity, such as gold or silver or alloys thereof. Moreover, the inner conductive material may be made of a material having high hardness, such as copper or iron or alloys thereof. In addition, in order to make sure the bolt 311 can be smoothly slid in the bolt hole 331, the inner surface 3313 of the bolt hole 331 is preferably made of a material having a low friction coefficient, such as graphite.

The elastic element 32 may be made of either conductive material or insulating material. If the elastic element 32 is made of insulating material, the current can still be smoothly transmitted on the bolt type probe 30. Furthermore, the cross-section area of the bolt 311 of the probe head 31 is greater than the cross-section area of the elastic material of the elastic element 32 as viewed from a cross-section (i.e., Y-Z plane). Thus, if the elastic element 32 is made of conductive material, the current is also primarily transmitted by the bolt 311, and the elastic element 32 can further exhibit the function of sharing the current transfer. In addition, in order to form the bolt type probe 30 having a small configuration and a high degree of coplanarity and high precision, the present disclosure preferably uses microelectromechanical systems (MEMS) technology to manufacture the bolt type probe 30. Furthermore, the probe head 31 and the probe tail 33 are manufactured by a combination of lithography and electroplating, the configuration of the bolt 311 of the probe head 31 and the bolt hole 331 of the probe tail 33 can be effectively adjusted, thereby controlling the outer surface 3111 of the bolt 311 and the inner surface 3313 of the bolt hole 331 have a large electrical contact area.

As described above, in the present disclosure, since the current is transmitted by the bolt 311 of the probe head 31 having a large cross-section area, rather than by the coil spring structure of the elastic element 32, the "needle burning" caused by the current exceeding the maximum withstand current of the elastic element 32 such that the elastic material of the elastic element 32 (as shown in FIG. 4, the coil spring structure) is deformed due to overheating can be prevented. In addition, since the bolt 311 of the probe head 31 is a linear cylindrical structure without bending, and the signal is transmitted through the linear path of the bolt 311, instead of by the spiral path of the elastic element 32, the transmission path of the signal is effectively shortened, and the effect of high frequency and high speed transmission is achieved, and the inductance resulting from signal transmission is also relatively small.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. A bolt type probe, comprising:
   a probe head comprising a bolt at one end thereof and a probe tip at another end of the probe head;
   a probe tail disposed on a same axis as the probe head, and the probe tail comprising a bolt hole corresponding to the bolt, wherein at least one portion of the bolt of the probe head is inserted into the bolt hole; and
   an elastic element connected with the probe head and the probe tail, and made of elastic material,
   wherein the bolt of the probe head is surrounded by the elastic material;
   wherein by either applying a force to or releasing the force from the probe head, the elastic element moves in a straight line;
   wherein when the elastic element moves in the straight line, the bolt moves relative to the bolt hole along with a movement of the elastic element;
   the probe head further comprises a first fixed piece disposed thereon, and a first slot corresponding to the first fixed piece is formed on a first opening end of the elastic element, and the elastic element is connected with the probe head by engaging the first slot with the first fixed piece; and
   the probe tail further comprises a second fixed piece disposed thereon, and a second slot corresponding to the second fixed piece is formed on a second opening end opposite a first opening end of the elastic element, and the elastic element is connected with the probe tail by engaging the second slot with the second fixed piece.

2. The bolt type probe as claimed in claim 1, wherein the bolt hole of the probe tail includes an opening and a bottom portion, when the force is released from the probe head, an end of the bolt is spaced a distance from the bottom portion of the bolt hole, and when the elastic element is compressed, the distance is shortened accordingly.

3. The bolt type probe as claimed in claim 1, wherein an outer surface of the bolt of the probe head contacts an inner surface of the bolt hole of the probe tail.

4. The bolt type probe as claimed in claim 3, wherein a material of the inner surface of the bolt hole of the probe tail comprises a conductive material with a low friction coefficient.

5. The bolt type probe as claimed in claim 4, wherein the conductive material with the low friction coefficient includes graphite.

6. The bolt type probe as claimed in claim 1, wherein a cross-section area of the bolt of the probe head is greater than a cross-section area of the elastic material of the elastic element.

7. The bolt type probe as claimed in claim 1, wherein the bolt of the probe head is a linear cylindrical structure without bending.

8. The bolt type probe as claimed in claim 1, wherein the probe head and the probe tail are constituted by an inner conductive material and an outer conductive material, and the outer conductive material covers the inner conductive material.

9. The bolt type probe as claimed in claim 8, wherein a conductivity of the outer conductive material is greater than a conductivity of the inner conductive material, and a hardness of the inner conductive material is greater than a hardness of the outer conductive material.

10. The bolt type probe as claimed in claim 1, wherein the bolt and the probe tip of the probe head are integrally formed.

* * * * *